US012216244B2

(12) United States Patent
Lee et al.

(10) Patent No.: US 12,216,244 B2
(45) Date of Patent: Feb. 4, 2025

(54) FLEXIBLE DISPLAY DEVICE

(71) Applicant: LG Display Co., Ltd., Seoul (KR)

(72) Inventors: Wansoo Lee, Goyang-si (KR);
Youngjoo Park, Busan (KR);
ByoungHar Hwang, Goyang-si (KR);
Taehyoung Kwak, Goyang-si (KR);
Changwoo Chun, Cheonan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 216 days.

(21) Appl. No.: 17/858,681

(22) Filed: Jul. 6, 2022

(65) Prior Publication Data

US 2023/0017835 A1 Jan. 19, 2023

(30) Foreign Application Priority Data

Jul. 8, 2021 (KR) .................. 10-2021-0089889

(51) Int. Cl.
*G06F 1/16* (2006.01)
*G02B 1/04* (2006.01)
*G02B 1/14* (2015.01)
*G09F 9/30* (2006.01)
*H10K 59/80* (2023.01)

(52) U.S. Cl.
CPC ............... *G02B 1/14* (2015.01); *G02B 1/04* (2013.01); *G09F 9/301* (2013.01); *H10K 59/8722* (2023.02); *G06F 1/16* (2013.01)

(58) Field of Classification Search
None
See application file for complete search history.

(56) References Cited

U.S. PATENT DOCUMENTS

| | | | | |
|---|---|---|---|---|
| 11,502,270 | B2* | 11/2022 | Song | H10K 77/111 |
| 11,800,652 | B2* | 10/2023 | Shin | B32B 3/085 |
| 11,926,139 | B2* | 3/2024 | Lee | B32B 27/36 |
| 2014/0315016 | A1* | 10/2014 | Dollase | C09J 153/00 428/339 |
| 2019/0051705 | A1* | 2/2019 | Breedlove | H01L 29/7842 |
| 2020/0051881 | A1* | 2/2020 | Park | B32B 3/04 |
| 2020/0159285 | A1 | 5/2020 | Kim | |
| 2022/0282130 | A1* | 9/2022 | Baby | C09J 9/00 |

FOREIGN PATENT DOCUMENTS

| | | |
|---|---|---|
| KR | 10-2010-0129512 A | 12/2010 |
| KR | 10-2019-0078226 A | 7/2019 |
| KR | 10-2020-0058634 A | 5/2020 |
| KR | 10-2020-0106789 A | 9/2020 |

* cited by examiner

*Primary Examiner* — Courtney L Smith
(74) *Attorney, Agent, or Firm* — Morgan, Lewis & Bockius LLP

(57) ABSTRACT

The present disclosure relates to a flexible display device, and more particularly, a flexible display device includes a display panel, and a cover member which is disposed on the display panel and includes a thin glass and an adhesive member disposed so as to enclose the thin glass, at this time, the adhesive member includes a first adhesive member disposed so as to enclose an upper surface and a side surface of the thin glass and a second adhesive member disposed on a lower surface of the thin glass. According to the present disclosure, the flexible display device disposes a protective film above the cover member to provide a scattering suppressing effect and improve a surface hardness, a compression characteristic, the impact resistance and folding characteristic.

20 Claims, 7 Drawing Sheets

FLEXIBLE DISPLAY DEVICE

CROSS-REFERENCE TO RELATED APPLICATIONS

This application claims the priority of Korean Patent Application No. 10-2021-0089889 filed on Jul. 8, 2021, in the Korean Intellectual Property Office, the disclosure of which is incorporated herein by reference.

BACKGROUND

Technical Field

The present disclosure relates to a flexible display device, and more particularly, to a flexible display device in which a surface hardness and a compression characteristic are enhanced and the impact resistance is improved while effectively suppressing scattering.

Discussion of the Related Art

As it enters an information era, a display field which visually expresses electrical information signals has been rapidly developed, and in response to this, various display devices having excellent performances such as thin-thickness, light weight, and low power consumption have been developed. Specific examples of such a display device include a liquid crystal display device (LCD), a plasma display panel device (PDP), a field emission display device (FED), and an organic light emitting display device (OLED).

Recently, a shape or a size of the display device has gradually diversified and in particularly, an interest in a flexible display device which maintains a display performance even though the display device is folded or rolled is consistently increasing. In accordance with this interest, researches and development on panels, fixtures, and cover windows having a specific radius of curvature are being actively conducted.

Specifically, the cover window is a component which is exposed to a user from an outer periphery of the display device. Accordingly, a cover glass having a more excellent appearance characteristic than a plastic cover window is desirably used. Due to the characteristic of the glass, when the thickness is limited to 0.1 mm or less, the cover window may have a folding characteristic. Due to this, even though the rigidity of the glass is considerably superior to the plastic, as mentioned above, the impact resistance is inferior to that of the plastic cover window which is freely designed in thickness within a limited thickness. Therefore, the cover glass is more vulnerable to the external impact than the plastic cover window and a protective film is laminated or a protective coating layer is formed to suppress fragments due to the damage caused by the impact.

SUMMARY

In the related art, when a thin glass is used as a cover member, an optical clear adhesive having a low modulus is mainly used to satisfy the folding characteristic. The optical clear adhesive having a low modulus is a semi-solid adhesive so that a protective film is simply laminated to be bonded to the thin glass to suppress the scattering. However, the optical clear adhesive having a low modulus is advantageous to relieve the folding stress, but has problems in that a surface hardness is degraded and the restoring force against the compression is low. Further, a residual failure frequently occurs in the optical clear adhesive having a low modulus during a process of laminating a thin glass and a protective film so that a process efficiency and a yield may be lowered.

Accordingly, embodiments of the present disclosure are directed to a flexible display device that substantially obviates one or more of the problems due to limitations and disadvantages of the related art.

An aspect of the present disclosure is to provide a flexible display device which efficiently suppresses the scattering and has an excellent impact resistance even using a glass having an excellent surface characteristic.

Another aspect of the present disclosure is to provide a flexible display device which has an excellent folding characteristic while improving a surface hardness deterioration and improving a restoring characteristic against the compression.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a flexible display device comprises a display panel, and a cover member which is disposed on the display panel and includes a thin glass and an adhesive member disposed so as to enclose the thin glass, at this time, the adhesive member includes a first adhesive member disposed so as to enclose an upper surface and a side surface of the thin glass and a second adhesive member disposed on a lower surface of the thin glass.

In another aspect, a flexible display device comprises a protective film disposed on a cover member, a first hard coating layer disposed on an upper surface of the protective film, and a second hard coating layer which is disposed on a lower surface of the protective film and includes silicone resin.

Other detailed matters of the exemplary embodiments are included in the detailed description and the drawings.

According to the present disclosure, the flexible display device of the present disclosure includes a cover member in which an adhesive member is disposed so as to enclose an upper surface, a lower surface, and a side surface of the thin glass to improve the impact resistance.

Further, according to the present disclosure, the flexible display device disposes a protective film above the cover member to provide a scattering suppressing effect and improve a surface hardness and a compression characteristic.

Further, according to the present disclosure, the cover member is formed to have a width and a length which are equal to those of the protective film disposed thereabove and the adhesive member is disposed so as to enclose the side surface of the thin glass. Therefore, not only the upper surface and the lower surface of the thin glass, but also the side surface is protected from the external impact so that the damage of the cover member is minimized.

Further, according to the present disclosure, the cover member may minimize the residual failure of the adhesive member during the manufacturing process and can be easily handled so that the productivity of the flexible display device is improved.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
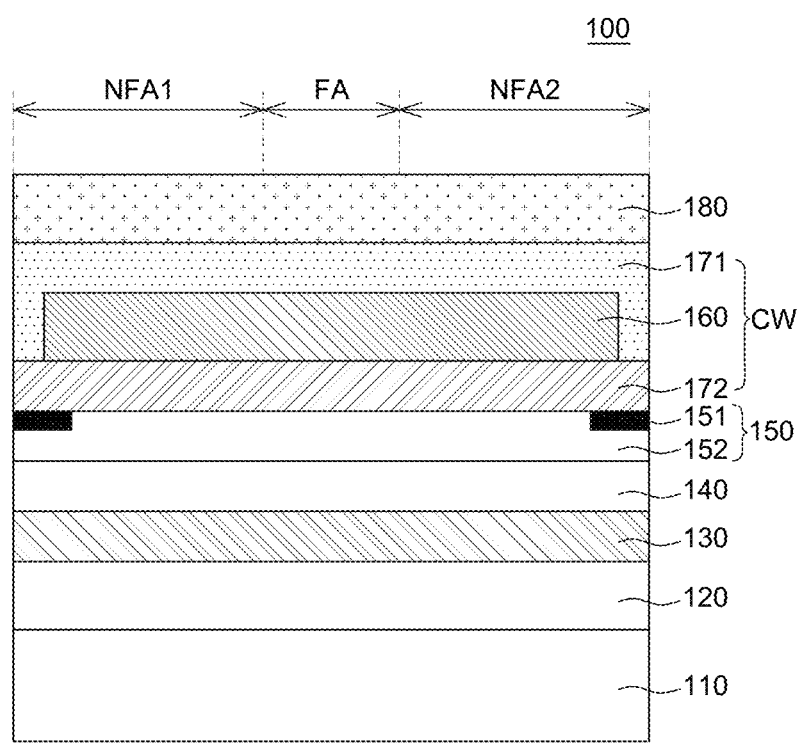
FIG. 1 is a cross-sectional view of a flexible display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, the element or layer is disposed directly on another element or layer, or other element or layer may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a flexible display device according to exemplary embodiments of the present disclosure will be described in detail with reference to accompanying drawings.

FIG. 1 is a cross-sectional view of a flexible display device according to an exemplary embodiment of the present disclosure. Referring to FIG. 1, a flexible display device 100 according to an exemplary embodiment of the present disclosure includes a plate assembly 110, a back plate 120, a display panel 130, an optical control layer 140, a cover member CW, and a protective film 180. The cover member CW includes a thin glass 160, a first adhesive member 171, and a second adhesive member 172.

Hereinafter, components of the flexible display device 100 according to an exemplary embodiment of the present disclosure will be described.

The flexible display device 100 includes at least one folding area FA and two or more non-folding areas NFA1 and NFA2. The folding area FA is an area which is folded when the flexible display device 100 is folded and is folded along a specific radius of curvature with respect to a folding axis. The non-folding areas NFA1 and NFA2 are areas which are not folded when the flexible display device 100 is folded. That is, the non-folding areas NFA1 and NFA2 maintain a flat state when the flexible display device 100 is folded. The non-folding areas NFA1 and NFA2 may be located on both sides of the folding area FA.

When the flexible display device 100 is folded, the folding area FA is folded with respect to the folding axis and the folding area FA may form a part of a circle or an oval. At this time, a radius of curvature of the folding area FA may refer to a radius of a circle or an oval formed by the folding area. When the folding area FA is folded with respect to the folding axis, the non-folding areas NFA1 and NFA2 overlap each other. When a top surface of the flexible display device 100 on which images are displayed is defined as a display surface and a bottom surface of the flexible display device 100 which is an opposite surface of the display surface is defined as a rear surface, the folding area FA may be folded by a manner selected from an out-folding manner and an in-folding manner. According to the out-folding manner, the folding area is folded to expose the display surface of the flexible display device 100 to the outside and according to the in-folding manner, the folding area is folded such that display surfaces of the flexible display device 100 face each other.

The display panel 130 displays images. For example, the display panel 130 may be a liquid crystal display panel which adjusts a light transmittance of liquid crystals to display images. As another example, the display panel 130 may be an organic light emitting display panel which includes an organic light emitting layer to display images using light emitted from the organic light emitting layer. Hereinafter, for the convenience of description, the description will be made with an example that the display panel is an organic light emitting display panel, but it is not limited thereto.

The display panel 130 is divided into a display area and a non-display area. The display area is an area where a plurality of pixels is disposed to display images. In the display area, pixels including an emission area for displaying images and a driving circuit for driving the pixels may be disposed. The non-display area is disposed so as to enclose the display area. The non-display area is an area where images are not displayed and various wiring lines, driving ICs, and printed circuit boards for driving the pixels and the driving circuits disposed in the display area are disposed.

The display panel 130 may include a flexible substrate and an organic light emitting diode.

The flexible substrate supports various elements which configure the display panel. The flexible substrate may be a plastic substrate having flexibility. For example, the plastic substrate may be selected from polyimide, polyethersulfone, polyethylene terephthalate, and polycarbonate, but is not limited thereto. The plastic substrate has a relatively weak barrier characteristic against moisture or oxygen so that in order to compensate therefor, the plastic substrate may have a structure in which a plastic film and an inorganic layer are laminated. For example, the flexible substrate may have a multilayered structure in which a first polyimide film, an inorganic film, and a second polyimide film are sequentially laminated.

The organic light emitting diode is disposed on the flexible substrate. The organic light emitting diode may include an anode, a cathode, and an organic light emitting layer disposed therebetween. In the organic light emitting diode, holes injected from the anode and electrons injected from the cathode are coupled on the organic light emitting layer to emit light. The image may be displayed using the light emitted as described above.

A driving thin film transistor may be disposed between the flexible substrate and the organic light emitting diode to drive the organic light emitting diode. The driving thin film transistor may be disposed in each of the plurality of sub pixel areas. For example, the driving thin film transistor includes a gate electrode, an active layer, a source electrode, and a drain electrode. Specifically, for example, the active layer is disposed on the flexible substrate and a gate insulating layer is disposed on the active layer to insulate the active layer from the gate electrode. Further, an interlayer insulating layer which insulates the gate electrode from the source electrode and the drain electrode is disposed on the substrate. The source electrode and the drain electrode which are in contact with the active layer are formed on the interlayer insulating layer. A planarization layer may be disposed between the thin film transistor and the organic light emitting diode. The planarization layer planarizes an upper portion of the thin film transistor. The planarization layer may include a contact hole which electrically connects the thin film transistor and the anode.

When the flexible display device 100 is folded or bended, the display panel 130 having a flexibility may have difficulty to maintain a predetermined shape and may be vulnerable to external stimulus.

Accordingly, various types of supporting members may be disposed on the rear surface of the display panel 130. For example, a back plate 120 and a plate assembly 110 may be disposed on the rear surface of the display panel 130.

When a plastic flexible substrate is used, a thickness is small so that the display panel 130 may be sagged during the folding or bending and in order to supplement for this, a back plate 120 may be disposed on the rear surface of the display panel 120.

For example, the back plate 120 may be a metal material such as stainless steel (SUS) or Invar and may be formed of a plastic material such as polymethylmetacrylate (PMMA), polycarbonate (PC), polyvinylalcohol (PVA), acrylonitirlebutadiene-styrene (ABS), polyethylene terephthalate (PET), silicone, or polyurethane (PU).

The flexible substrate and the back plate 120 may be bonded by an adhesive layer disposed therebetween. For example, the adhesive layer may be selected from an optical clear adhesive (OCA) and a pressure sensitive adhesive (PSA), but is not limited thereto.

The plate assembly 110 includes a plate top and a plate bottom. The plate top and the plate bottom may be integrally formed and if necessary, the plate top or the plate bottom may be omitted.

For example, the plate bottom may be a metal material such as stainless steel (SUS) or Invar and may be formed of a plastic material such as polymethylmetacrylate (PMMA), polycarbonate (PC), polyvinylalcohol (PVA), acrylonitirlebutadiene-styrene (ABS), polyethylene terephthalate (PET), silicone, or polyurethane (PU).

At least one opening pattern may be formed on the plate bottom so as to correspond to the folding area FA of the display device 100. The opening pattern allows the plate assembly 110 of the folding area FA to be easily folded and effectively relieves the stress applied to the plate assembly 110 during the folding. Further, in order to easily restore after the folding, the folding characteristic of the flexible display device 100 may be improved. The opening patterns may be formed with different shapes or different intervals in the folding area FA. For example, the opening pattern may have a rectangular shape, a rhombus shape, or a circular shape.

The plate top may be disposed between the back plate 120 and the plate bottom. The plate top is formed of a material having a high rigidity to enhance the rigidity of the display panel 130. Further, the plate top may suppress a phenomenon that the opening pattern of the plate bottom is visible through the display panel 130. For example, the plate top may be formed of a metal material such as stainless steel (SUS), invar, aluminum, or magnesium. As another example, the plate top may be formed of a plastic material such as polymethylmetacrylate (PMMA) or polycarbonate (PC).

The plate assembly 110 and the back plate 120 may be bonded by an optical clear adhesive or a pressure sensitive adhesive.

The optical control layer 140 is disposed on the display panel 130. The optical control layer 140 uniformly transmits light emitted from the display panel 130 to the outside without lowering a luminance of the flexible display device 100 and absorbs or reflects external light to improve a display quality. For example, the optical control layer 140 may be a polarizing film, but is not limited thereto.

The optical control layer 140 may be bonded onto the display panel 130 by means of an optical clear adhesive or a pressure sensitive adhesive.

A decoration layer 150 may be disposed on the optical control layer 140. The decoration layer 150 may be bonded onto the optical control layer 140 by means of an optical clear adhesive or a pressure sensitive adhesive. The decoration layer 150 may include a decoration pattern 151 formed with a material which absorbs light and an over coat layer 152 formed of a transparent resin. For example, the decoration pattern 151 may be formed of an optical absorption metal, carbon black, or black resin. The decoration pattern 151 is formed so as to overlap the non-display area of the display panel 130. Therefore, the decoration layer 150 does not allow components such as wiring lines disposed in the non-display area to be visible to the outside. Further, the decoration layer 150 also serves to suppress the light leakage through the side surface of the flexible display device 100. The decoration pattern 151 may be disposed so as to be adjacent to a lower surface of the cover member. However, it is not limited thereto and the decoration pattern 151 may be disposed below the decoration layer 150 to be adjacent to the optical control layer 140. The over coat layer 152 covers a step formed by the decoration pattern 151 to planarize a surface on which the decoration pattern 151 is formed. For example, the over coat layer 152 may include one or more selected from acrylic resin, epoxy resin, siloxane resin, and urethane resin, but is not limited thereto.

The cover member CW is disposed on the decoration layer 150. The cover member CW protects the display panel 130 so as not to be damaged by an external impact or deteriorated by moisture, oxygen, or foreign substances entering from the outside. The cover member CW may be bonded onto the decoration layer 150 by means of an optical clear adhesive or a pressure sensitive adhesive.

The cover member CW includes a thin glass 160 and an adhesive member 170 configured by a first adhesive member 171 and a second adhesive member 172.

A thickness of the thin glass 160 may be 0.1 mm or smaller, 50 µm to 0.1 mm, or 70 µm to 90 µm. The thin glass 160 having such a thickness has an advantage of excellent folding characteristic.

The thin glass 160 may be a chemically strengthened glass. The chemically strengthened glass is a glass which is strengthened by a chemical strengthening method. The chemical strengthening method is a process of enhancing the strength of the glass by an ion exchange method which replaces sodium ions included in the glass with ions having an ion radius larger than that of the sodium ions. Ions having an ion radius larger than that of sodium ions which configure the glass are permeated so that a compressive stress layer is formed on the glass surface to enhance the strength.

For example, the chemically strengthened glass may be prepared by a process of immersing glass in a potassium salt solution such as potassium nitride and substituting the sodium ions of the glass with potassium ions while heating at 200° C. to 450° C. for a predetermined time, but is not limited thereto. 200° C. to 450° C. is a temperature which is equal to or lower than a glass transition temperature.

When the chemically strengthened glass is used as the thin glass 160, the impact resistance is improved while maintaining a high folding characteristic. Further, the scratch resistance is improved and the compression during the folding or bending is suppressed.

The adhesive member 170 is disposed so as to enclose an upper surface, a lower surface, and a side surface of the thin glass 160. For example, the adhesive member 170 includes the first adhesive member 171 disposed so as to enclose the upper surface and the side surface of the thin glass 160 and the second adhesive member 172 disposed on the lower surface of the thin glass 160. That is, the first adhesive member 171 is disposed on the upper surface of the thin glass 160 and extends so as to enclose the side surface of the thin glass 160. As described above, the first adhesive member 171 and the second adhesive member 172 are disposed so as to enclose six surfaces of the thin glass 160 so that the transmission of the impact applied from the outside to the thin glass 160 may be minimized. Further, even though the external impact is transmitted to the thin glass 160, the impact is dispersed by the adhesive member 170 so that the damage of the thin glass 160 may be minimized. Accordingly, the impact resistance of the flexible display device 100 is improved.

For example, moduli of the first adhesive member 171 and the second adhesive member 172 may be 500 MPa to 10000 MPa. When the modulus of the adhesive member 170 is smaller than 500 MPa, the improvement of the surface hardness and the compression characteristic of the flexible display device 100 may be insignificant. Further, the residual failure is caused during the process of disposing the adhesive member 170 on the upper surface, the lower surface, and the side surface of the thin glass 160 so that the process efficiency may be degraded. When the modulus of the adhesive member 170 exceeds 10000 MPa, the folding characteristic of the flexible display device 100 may be degraded.

Specifically, for example, moduli of the first adhesive member 171 and the second adhesive member 172 may be 500 MPa to 3000 MPa. In this case, the folding characteristic is specifically excellent so that it is possible to easily implement the flexible display device 100 having a larger curvature. Alternatively, moduli of the first adhesive member 171 and the second adhesive member 172 may be 7000 MPa to 10000 MPa. In this case, the surface hardness and the compression characteristic of the flexible display device 100 may be more excellent. Further, the residual failure during the process of forming an adhesive member may be minimized while maintaining a folding characteristic to be high.

For example, the first adhesive member 171 and the second adhesive member 172 may be formed of the same material. Accordingly, the first adhesive member 171 and the second adhesive member 172 may have the same modulus.

As another example, the first adhesive member 171 and the second adhesive member 172 may have different moduli. As described above, when the first adhesive member 171 and the second adhesive member 172 have different moduli, the folding characteristic may be further improved while maintaining the surface hardness and the compression recovery characteristic to be high.

Specifically, in the case of the in-folding in which the folding area FA of the flexible display device 100 faces the display surface of the flexible display device 100, the modulus of the first adhesive member 171 may be larger than the modulus of the second adhesive member 172. For example, the modulus of the first adhesive member 171 is 7000 MPa to 10000 MPa and the modulus of the second adhesive member 172 is 500 MPa to 3000 MPa. During the in-folding, a stress applied to the lower surface is larger than a stress applied to the upper surface of the thin glass 160. Accordingly, when the second adhesive member 172 disposed on the lower surface of the thin glass 160 has a smaller modulus than the first adhesive member 171, the stress applied onto the lower surface of the thin glass 160 may be effectively relieved while maintaining the surface hardness and the compression recovery characteristic to be high.

As another example, in the case of the out-folding in which the folding area FA of the flexible display device 100 is exposed to the outside of the display surface of the flexible display device 100, the modulus of the first adhesive member 171 may be smaller than the modulus of the second adhesive member 172. For example, the modulus of the first adhesive member 171 is 500 MPa to 3000 MPa and the modulus of the second adhesive member 172 is 7000 MPa to 10000 MPa. During the out-folding, a stress applied to the upper surface is larger than a stress applied to the lower surface of the thin glass 160. Therefore, the first adhesive member 171 disposed on the upper surface of the thin glass 160 is formed to have a lower modulus than the second adhesive member 172 disposed on the lower surface so that the folding stress may be relieved while maintaining the surface hardness and the compression recovery characteristic to be high.

The first adhesive member 171 and the second adhesive member 172 may be formed of an optical clear resin. The optical transparent resin is a liquid adhesive so that it is advantageous to form the adhesive member 170 so as to enclose the upper surface, the lower surface, and the side surface of the thin glass 160. A process of forming the adhesive member 170 will be described below.

The protective film 180 is disposed on the cover member CW. The protective film 180 protects the display panel 130 from external impact, scratches, or foreign substances and suppresses the scattering of the fragments when the cover member CW is broken.

The protective film 180 may be a plastic film including at least one selected from polyethylene terephthalate, polyethylene naphthalate, polyethylene, polymethyl methacrylate, polyimide, polyamideimide, polycarbonate, and cycloolefin (co)polymer, but is not limited thereto.

Hereinafter, a process of laminating the cover member CW and the protective film 180 will be described in more detail with reference to FIGS. 2A to 2F.

FIGS. 2A to 2F are cross-sectional views for explaining a process of laminating a cover member CW and a protective film 180 according to an exemplary embodiment of the present disclosure.

Figure 2A:
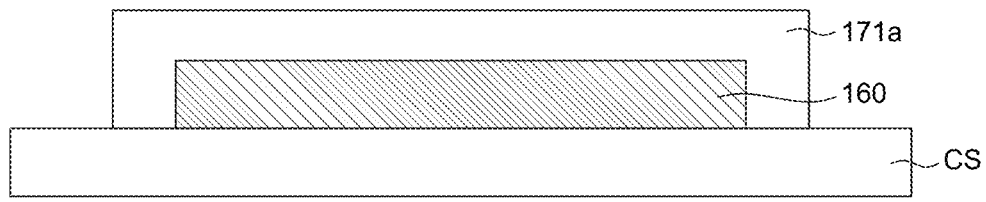
FIGS. 2A to 2F are cross-sectional views for explaining a process of laminating a cover member and a protective film according to an exemplary embodiment of the present disclosure.

First, referring to FIG. 2A, after disposing a thin glass 160 on a carrier substrate CS, an optical clear resin is applied on a first surface of the thin glass 160 to overflow. The optical clear resin is a liquid adhesive so that the optical clear resin flows down along a side surface of the thin glass 160 from the first surface of the thin glass 160. Therefore, a first optical clear resin layer 171a is formed so as to enclose the first surface and the side surface of the thin glass 160. For example, the optical clear resin may be applied using a known method such as a slit coating method, a bar coating method, a dispensing method, and a screen printing method.

Figure 2B:
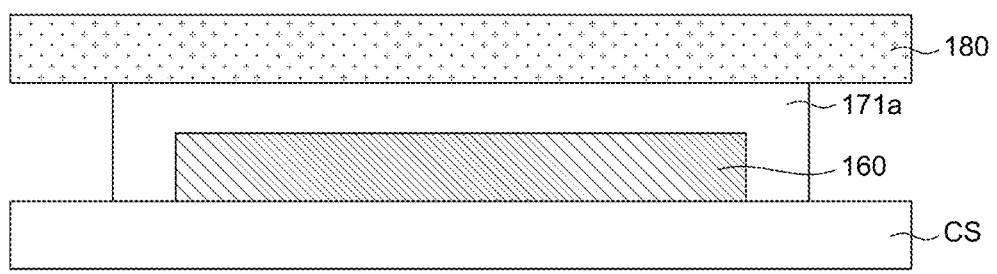

Next, referring to FIG. 2B, the protective film 180 is laminated on the first optical clear resin layer 171a and then cured. The first optical clear resin layer 171a is cured to form a first adhesive member 171. The first adhesive member 171 is formed so as to enclose the first surface and the side surface of the thin glass 160. Further, the thin glass 160 and the protective film 180 are bonded by the first adhesive member 171. Thereafter, the carrier substrate CS is removed.

Figure 2C:
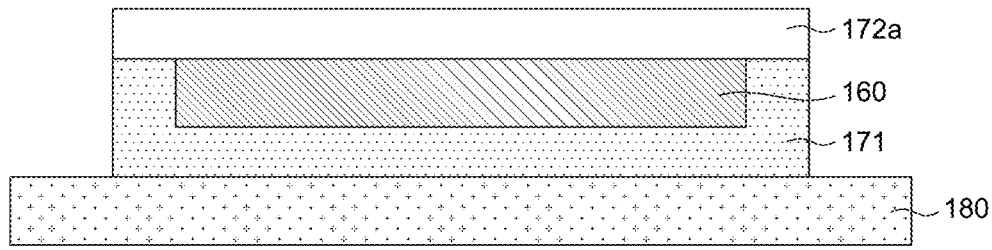

Next, referring to FIG. 2C, after adjusting a position of a cell such that the protective film 180 faces downward, an optical clear resin is applied on a second surface which is opposite to the first surface to overflow. Therefore, a second optical clear resin layer 172a is formed on the second surface of the thin glass 160. At this time, the overflowing optical clear resin flows to the side surface from the second surface of the thin glass 160 to be applied on the side surface of the thin glass 160.

Figure 2D:
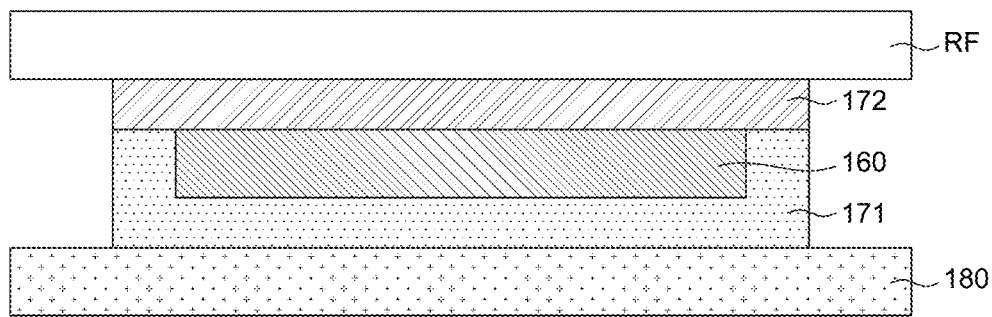

Next, referring to FIG. 2D, a releasing film RF is laminated on the second optical clear resin layer 172a and then cured. The second optical clear resin layer 172a is cured to form a second adhesive member 172. Accordingly, the first adhesive member 171 is disposed so as to enclose the first surface and the side surface of the thin glass 160 and the second adhesive member 172 is disposed on the second surface of the thin glass 160. Therefore, the upper surface, the lower surface, and the side surface of the thin glass 160 are enclosed by the adhesive member 170.

As described above, thicknesses of the first adhesive member 171 and the second adhesive member 172 formed using the optical clear resin may be 1 μm to 10 μm to be very thin. Accordingly, the flexible display device 100 may have a slim thickness and the folding characteristic is improved. For the purpose of handling easiness and process convenience, the semisolid optical clear adhesive or pressure sensitive adhesive has a thickness of 20 μm to 30 μm so that it is restricted to reduce the thickness of the flexible display device and further improve the folding characteristic.

Figure 2E:
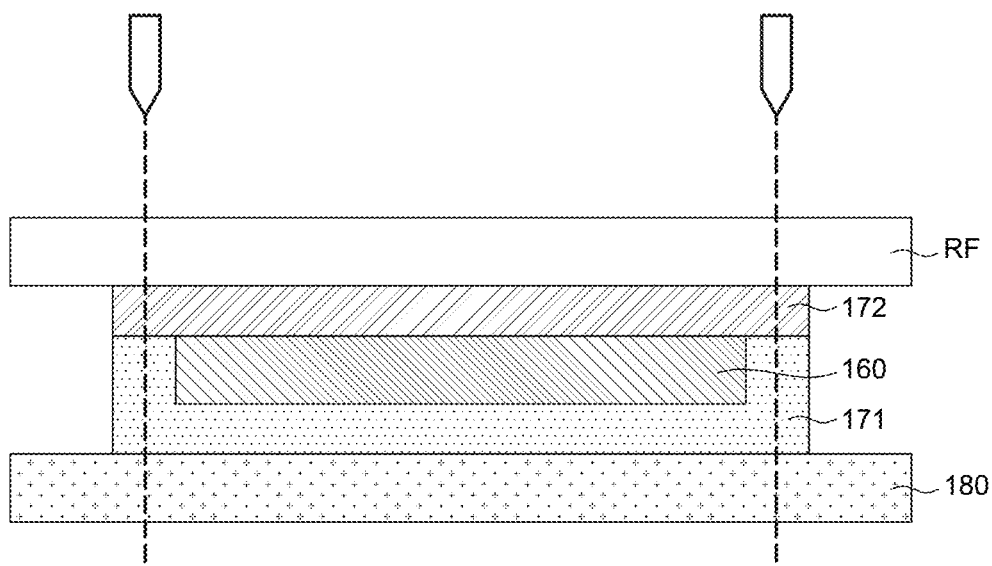

Next, referring to FIG. 2E, a laminated structure illustrated in FIG. 2D is cut. After processing a desired dimension, the laminated structure is cut using a general method. At this time, the cutting is performed to remove a part of the first adhesive member 171 which encloses the side surface of the thin glass 160 so as not to expose the side surface of the thin glass 160. Specifically, when the chemically strengthened thin glass 160 is used, it is not possible to cut the thin glass 160 without causing a damage so that it is desirable to cut to remove a part of the first adhesive member 171 which encloses the side surface of the thin glass 160.

Accordingly, as illustrated in FIG. 2D, the cover member CW and the protective film 180 have the same shape and the same area. That is, a width and a length of the cover member CW are equal to a horizontal length and a vertical length of the protective film 180.

As described above, when the chemically strengthened thin glass 160 is used, it is not possible to cut the thin glass 160 without causing the damage. Therefore, when a semisolid adhesive such as an optical clear adhesive or a pressure sensitive adhesive is used, the laminated structure is manufactured by laminating the protective film on a thin glass processed in advance with a dimension after attaching the adhesive onto the protective film. In this case, the protective film, the adhesive member, and the thin glass have different widths and lengths. Further, even though the dimensional processing is performed on the protective film, the adhesive member, and the thin glass to have the same width and length, and then laminated, the attachment tolerance is large due to the characteristic of the process. Further, the side surface of the thin glass is exposed to the outside so that the side surface is vulnerable to the external impact.

Unlike this, in the flexible display device 100 of the present disclosure, the cover member CW is formed to have the same width and length as the width and length of the protective film 180 without having an attachment tolerance. Further, the adhesive member 170 is disposed to enclose the upper surface, the lower surface, and the side surface of the thin glass 160 so that not only the upper surface and the lower surface of the thin glass 160, but also the side surface is protected from the external impact.

Figure 3:
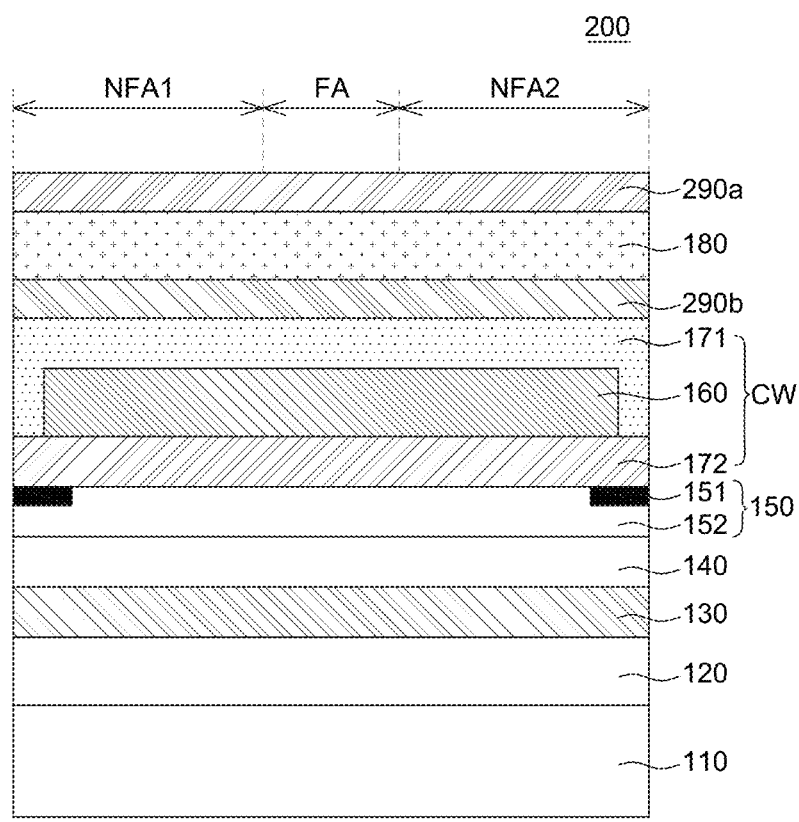
FIG. 3 is a cross-sectional view of a flexible display device according to another exemplary embodiment of the present disclosure.

FIG. 3 is a cross-sectional view of a flexible display device according to another exemplary embodiment of the present disclosure. A flexible display device 200 illustrated in FIG. 3 is substantially the same as the flexible display device 100 illustrated in FIG. 1 except that a first hard coating layer 290a and a second hard coating layer 290b are further included so that a redundant description will be omitted.

The hard coating layer may be disposed on at least one surface of the upper surface and the lower surface of the protective film 180. For example, the first hard coating layer 290a is disposed on an upper surface of the protective film 180 and the second hard coating layer 290b is disposed on a lower surface of the protective film 180.

For example, the first hard coating layer 290a may be formed of acrylic resin. The first hard coating layer 290a formed of acrylic resin has advantageous of excellent surface hardness and excellent optical characteristic. For example, the thickness of the first hard coating layer 290a may be 5 µm to 20 µm.

For example, the second hard coating layer 290b may be formed of silicone resin. The silicone resin has excellent impact resistance and elasticity more than the acrylic resin. Therefore, when the second hard coating layer 290b disposed below the protective film 180 is formed of silicone resin, the external impact is absorbed to minimize the damage of the cover member. Further, there is an advantage in that when the flexible display device 200 is folded or compressed by the pen-touch, the recovery characteristic is excellent. Specifically, the silicone resin may be an epoxy modified silicone resin. It has an excellent restoring force for the impact resistance and compression while maintaining the surface hardness to be high. For example, the thickness of the second hard coating layer 290b may be 30 µm to 60 µm. When the thickness of the second hard coating layer 290b is too small, the recovery characteristic improvement against the impact resistance and the compression may be insignificant. When the thickness of the second hard coating layer 290b is too large, it is limited to reduce the thickness of the flexible display device 200 and a stress which is applied to the device when the flexible display device 200 is folded or bent is increased to cause crack or separation between layers, thereby deteriorating the folding characteristic.

The flexible display device 200 illustrated in FIG. 3 provides an improved durability of the flexible display device 200 by the first and second hard coating layers 290a and 290b. Specifically, when the second hard coating layer 290b is formed of silicone resin, the buffering characteristic and the restoring characteristic against the compression may be improved. Accordingly, the thin glass 160 and the display panel 130 are protected from the external impact to minimize the damage and the restoring force for the compression due to the usage of the touch pan is excellent.

Figure 4:
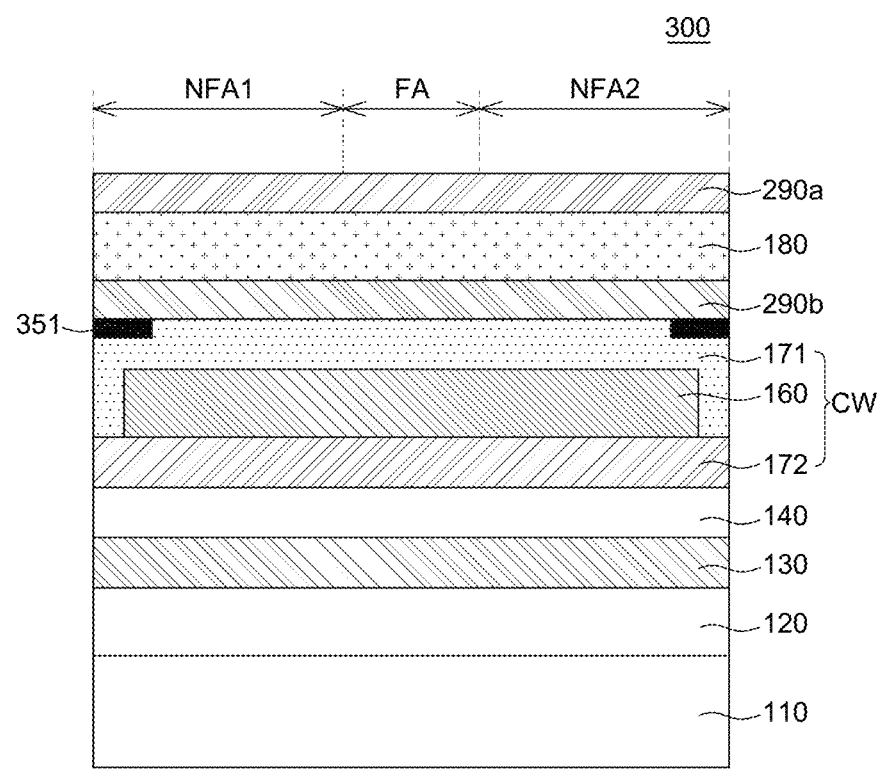
FIG. 4 is a cross-sectional view of a flexible display device according to still another exemplary embodiment of the present disclosure.

FIG. 4 is a cross-sectional view of a flexible display device according to still another exemplary embodiment of the present disclosure. Except that the decoration layer 150 is removed and a position of the decoration pattern is changed, a foldable display device 300 illustrated in FIG. 4 is substantially the same as the foldable display device 200 illustrated in FIG. 3, so that a redundant description will be omitted.

Referring to FIG. 4, as the decoration layer is removed, in the flexible display device 300 according to another exemplary embodiment of the present disclosure, the cover member CW is disposed on the optical control layer 140. The cover member CW may be bonded onto the optical control layer 140 by means of an optical clear adhesive or a pressure sensitive adhesive.

Instead of the decoration layer, a decoration pattern 351 is disposed at an interface at which the cover member CW and the protective film 180 are in contact with each other. The decoration pattern 351 is disposed so as to be in contact with the lower surface of the protective film 180 corresponding to the non-display area. An end of the decoration pattern 351 may be formed so as to match an end of the protective film 180 and an end of the first adhesive member 171.

The decoration pattern 351 having the above-described structure may be manufactured by forming the decoration pattern 351 on the protective film 180 before laminating the protective film 180 on one surface of the thin glass 160. In this case, the step of the decoration pattern 351 is covered by the optical clear resin which is applied to form the adhesive member 170. Therefore, a process of forming an over coating layer to cover the step of the decoration pattern 351 may be omitted. Accordingly, the structure of the flexible display device 300 is simplified and the process becomes simple. Further, as the decoration layer is removed, the thickness of the flexible display device 300 is reduced and the folding characteristic is further improved.

Figure 5:
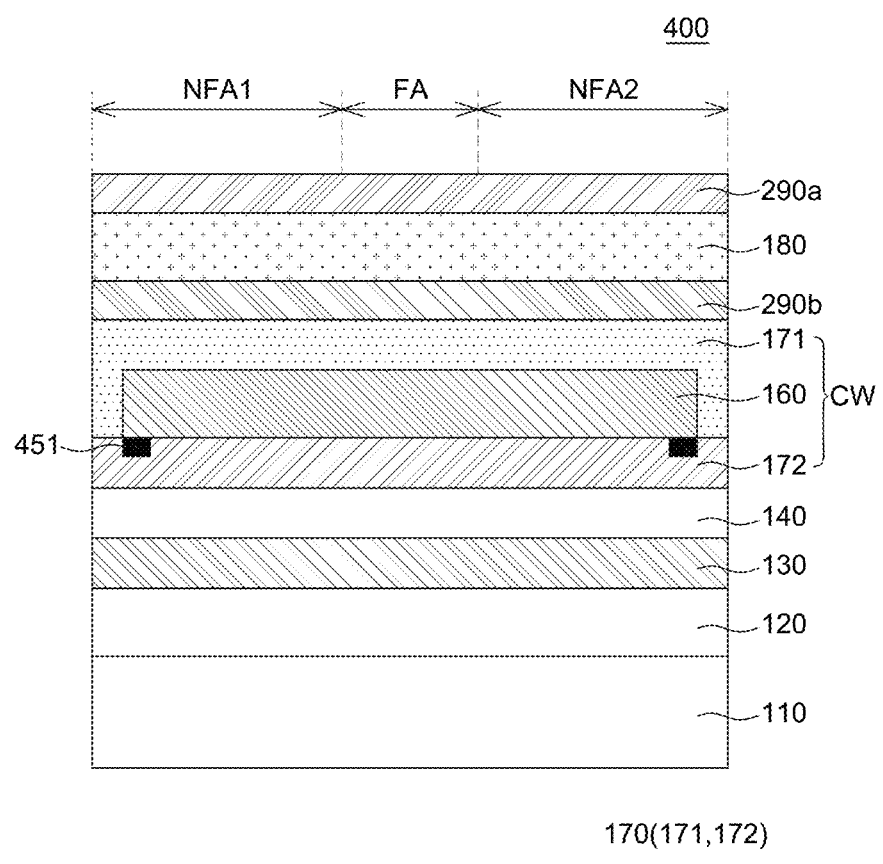
FIG. 5 is a cross-sectional view of a flexible display device according to still another exemplary embodiment of the present disclosure.

FIG. 5 is a cross-sectional view of a flexible display device according to still another exemplary embodiment of the present disclosure. Except that a position of the decoration pattern is changed, a foldable display device 400 illustrated in FIG. 5 is substantially the same as the foldable display device 300 illustrated in FIG. 4, so that a redundant description will be omitted.

Referring to FIG. 5, the decoration pattern 451 is disposed so as to be in contact with a lower surface of the thin glass 160. An end of the decoration pattern 451 may be disposed so as to match one end of the thin glass 160. Even though in FIG. 5, it is illustrated that the decoration pattern 451 is disposed so as to be in contact with the lower surface of the thin glass 160, it is not limited thereto. The decoration pattern 451 may be disposed so as to be in contact with the upper surface of the thin glass 160.

The decoration pattern 451 with the above-described structure may be manufactured by forming the decoration pattern 451 on the thin glass 160 before applying an optical clear resin on the thin glass 160. After forming the decoration pattern 451 on the thin glass 160, the optical clear resin is applied to cover the step caused by the decoration pattern 451. Therefore, a process of forming an overcoat layer to cover the step of the decoration pattern 451 may be omitted. Accordingly, the structure of the flexible display device 400 is simplified and the process becomes simple. Further, as the decoration layer is deleted, the thickness of the flexible display device 400 is reduced and the folding characteristic is further improved.

Hereinafter, the effects of the present disclosure will be described in more detail with reference to Embodiments and Comparative Embodiments. However, the following Embodiments are set forth to illustrate the present disclosure, but the scope of the disclosure is not limited thereto.

Embodiment 1

Figure 2F:
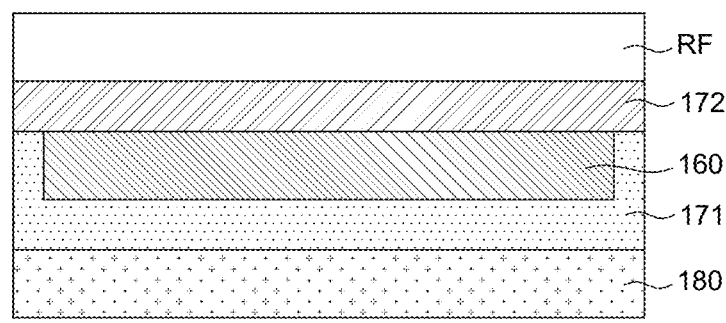

First, a thin glass having a thickness of 70 µm and a protective film having a thickness of 50 µm was prepared. At this time, a first hard coating layer including acrylate resin was formed above the protective film to have a thickness of 14 µm. Next, a laminated structure having the same structure as illustrated in FIG. 2F was produced by applying an optical clear resin and laminating a protective film according to the processes illustrated in FIGS. 2A to 2F. First and second adhesive members were formed from the finally produced structure to have a modulus of 7000 MPa to 10000 MPa.

Embodiment 2

The laminated structure was produced by the same way as Embodiment 1 except that a second hard coating layer including an epoxy modified silicone resin was formed below the protective film to have a thickness of 40 μm in Embodiment 1.

Embodiment 3

The laminated structure was produced by the same way as Embodiment 1 except that a second hard coating layer including an epoxy modified silicone resin was formed below the protective film to have a thickness of 50 μm in Embodiment 1.

Comparative Embodiment 1

First, the same thin glass and the protective film as those used in Embodiment 1 and an optical clear adhesive (modulus is 1000 Pa to 10000 Pa) with a thickness of 25 μm were prepared. The thin glass and the protective film were bonded with the optical clear adhesive therebetween to produce a structure in which the thin glass, the optical clear adhesive, and the protective film are laminated in this order.

Comparative Embodiment 2

A protective coating layer (thickness was 10 μm) was formed by applying urethane acrylate was applied above a thin glass with a thickness of 70 μm so that the urethane acrylate covered an upper surface and a side surface of the thin glass.

Experimental Embodiment

A surface hardness, a compression characteristic, and an impact resistance of laminated structures produced as described above were measured.

1. Surface Hardness

A surface of a specimen was scratched with a pencil under the condition of an angle of 45 degrees and a speed of 300 mm/min while applying a load of 500 g to the specimen according to Embodiment 1 and Comparative Embodiments 1 and 2 and then whether the surface was scratched was observed with the naked eye. The result thereof was filled in the following Table 1.

2. Compression Characteristic of Laminated Structure

First, after pressing a specimen with a pencil for one minute while applying a load of 350 gf to the specimen according to Embodiment 1, and Comparative Embodiments 1 and 2, the specimen was left for 24 hours. After observing whether there was a scratch or compression with the naked eye after 24 hours, it was evaluated as high, intermediate, and low. When there was almost no damage such as scratches or compression, it was evaluated as high and when the damage is severe, it was evaluated as low. The result thereof was filled in the following Table 1.

3. Impact Resistance

A ball drop test was conducted using a method specified in ASTM F3007. After free-falling a metal ball to the specimen according to Embodiment 1 and Comparative Embodiments 1 and 2, a degree of broken specimen was evaluated. When there was little damage to the specimen, it was evaluated as high and when the damage was severe, it was evaluated as low. The result thereof was filled in the following Table 1.

4. Compression Characteristic of Display Device

A flexible display device was produced by placing a laminated structure according to Embodiments 1, 2 and 3 on the display panel. A punching strength of the flexible display device was measured using a universal testing machine (UTM). Specifically, a maximum punching load was measured by pressing the specimen with a punching probe while increasing a force applied to the specimen. It was measured for each of the folding area and the non-folding area. The maximum punching load was determined by a load when damages such as a bright spot or a dark spot were generated in the display panel, or the cover member was broken. The result thereof was filled in the following Table 2.

TABLE 1

|  | Em. 1 | Comp. Em. 1 | Comp. Em. 2 |
|---|---|---|---|
| Surface hardness | 4B | 6B or lower | F |
| Compression characteristic | Medium | Low | High |
| Impact resistance | High | Medium high | Low |

Referring to Table 1, the laminated structure according to Embodiment 1 has excellent surface hardness, compression characteristic, and impact resistance as compared with a laminated structure of Comparative Embodiment 1 which simply laminates the protective film using an optical clear adhesive. The laminated structure of Comparative Embodiment 1 includes an optical clear adhesive having a low modulus so that the compression recovery characteristic is inferior, and the surface hardness is also inferior. Unlike this, the laminated structure of Embodiment 1 is configured by coating six surfaces of the thin glass with an optical clear resin having a high modulus so that both the surface hardness and the impact resistance are excellent. Further, in the laminated structure of Embodiment 1 according to the present disclosure, the adhesive member encloses the upper surface, the lower surface, and the side surface of the thin glass so that all sides of the thin glass are effectively protected from the external impact to minimize the damage. Further, even though damage occurs due to the external impact, the scattering may be effectively suppressed. In contrast, in the laminated structure of Comparative Embodiment 1, the side portion of the thin glass is exposed so that there is a disadvantage in that the side portion is vulnerable to the external impact.

In the meantime, the laminated structure according to Comparative Embodiment 2 is a structure in which a protective coating layer is formed with urethane acrylate resin, instead of the protective film so that it is confirmed that the surface characteristic is more excellent than the protective film, but the impact resistance is inferior. Further, the protective coating layer using a coating material which is not a film type has a relatively small thickness so that there is a disadvantage in that the scattering suppressing effect is inferior.

On the basis of the experiment result, when the cover member including an adhesive member disposed so as to enclose all the upper surface, the lower surface, and the side surface of the thin glass is laminated with the protective film, it is understood that the surface hardness, the compression recovery, and the impact resistance are improved while effectively suppressing the scattering.

Further, a result obtained by measuring a punching strength of the flexible display panels according to Embodiments 1, 2, and 3 is as follows.

TABLE 1

|  | Embodiment 1 | Embodiment 2 | Embodiment 3 |
|---|---|---|---|
| Non-folding area [kgf] | 6.5 | 8 | 9 |
| Folding area [kgf] | 4 | 4.5 | 5 |

Referring to Table 2, it is confirmed that Embodiments 2 and 3 in which the hard coating layer is formed above and below the protective film have more excellent compression characteristic than that of Embodiment 1. Specifically, when a hard coating layer including an epoxy modified silicone resin is formed below the protective film, it is confirmed that the compression characteristic is further improved and in the case of Embodiment 3 having a larger thickness, the compression characteristic is the most excellent. On the basis of the experiment result, when the hard coating layer is further included above and below the protective film, not only the surface characteristic of the flexible display device is improved, but also the compression characteristic is significantly improved so that a display device with an excellent durability may be provided. Specifically, when a hard coating layer including an epoxy modified silicone resin is formed below the protective film to have a predetermined thickness, the compression characteristic is more significantly improved to minimize the damage due to the external impact and bright spot or dark spot problem.

The exemplary embodiments of the present disclosure can also be described as follows:

According to an aspect of the present disclosure, a flexible display device comprises a display panel, and a cover member which is disposed on the display panel and includes a thin glass and an adhesive member disposed so as to enclose the thin glass, wherein the adhesive member includes a first adhesive member disposed so as to enclose an upper surface and a side surface of the thin glass and a second adhesive member disposed on a lower surface of the thin glass.

A modulus of the first adhesive member may be equal to a modulus of the second adhesive member.

The first adhesive member and the second adhesive member may be formed of the same material.

A modulus of the first adhesive member may be different from a modulus of the second adhesive member.

The flexible display device may include a folding area and non-folding areas on both sides of the folding area, the folding area may be folded in an in-folding manner that a display surface of the flexible display device faces inward, and the modulus of the first adhesive member may be larger than the modulus of the second adhesive member.

The modulus of the first adhesive member may be 7000 MPa to 10000 MPa and the modulus of the second adhesive member may be 500 MPa to 3000 MPa.

The flexible display device may include a folding area and non-folding areas on both sides of the folding area, the folding area may be folded in an out-folding manner that a display surface of the flexible display device faces outward, and the modulus of the first adhesive member may be smaller than the modulus of the second adhesive member.

The modulus of the first adhesive member may be 500 MPa to 3000 MPa and the modulus of the second adhesive member may be 7000 MPa to 10000 MPa.

The adhesive member may be formed of an optical clear resin.

The flexible display device may further comprise a protective film disposed on the cover member.

A width and a length of the cover member may be equal to a width and a length of the protective film, respectively.

The protective film may be a plastic film including at least one selected from polyethylene terephthalate, polyethylene naphthalate, polyethylene, polymethyl methacrylate, polyimide, polyamideimide, polycarbonate, and cycloolefin (co) polymer.

The flexible display device may further comprise a hard coating layer disposed on at least one surface of the protective film.

The hard coating layer may include a first hard coating layer disposed on an upper surface of the protective film and a second hard coating layer disposed on a lower surface of the protective film.

The first hard coating layer may include an acrylic resin, and the second hard coating layer may include a silicone resin.

The silicone resin may be an epoxy modified silicone resin.

A thickness of the first hard coating layer may be 5 μm to 20 μm and a thickness of the second hard coating layer may be 30 μm to 60 μm.

The display panel may be divided into a display area and a non-display area which encloses the display area and may further include a decoration pattern disposed on one surface of the thin glass so as to overlap the non-display area.

The display panel may be divided into a display area and a non-display area which encloses the display area and may further include a decoration pattern disposed on a lower surface of the protective film so as to overlap the non-display area.

It will be apparent to those skilled in the art that various modifications and variations can be made in the flexible display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A flexible display device, comprising:
    a display panel; and
    a cover member which is disposed on the display panel and includes a thin glass and an adhesive member disposed so as to enclose the thin glass,
    wherein the adhesive member includes a first adhesive member disposed so as to enclose an upper surface and a side surface of the thin glass and a second adhesive member disposed on a lower surface of the thin glass,
    wherein the display panel is divided into a display area and a non-display area which encloses the display area, and the flexible display device includes a decoration pattern disposed above or below the thin glass so as to overlap the non-display area.

2. The flexible display device according to claim 1, wherein a Young's modulus of the first adhesive member is equal to a Young's modulus of the second adhesive member.

3. The flexible display device according to claim 2, wherein the first adhesive member and the second adhesive member are formed of the same material.

4. The flexible display device according to claim 1, wherein a Young's modulus of the first adhesive member is different from a Young's modulus of the second adhesive member.

5. The flexible display device according to claim 4, wherein the flexible display device includes a folding area and non-folding areas on both sides of the folding area, the folding area is folded in an in-folding manner that a display surface of the flexible display device faces inward, and the Young's modulus of the first adhesive member is larger than the Young's modulus of the second adhesive member.

6. The flexible display device according to claim 5, wherein the Young's modulus of the first adhesive member is 7000 MPa to 10000 MPa, and the Young's modulus of the second adhesive member is 500 MPa to 3000 MPa.

7. The flexible display device according to claim 4, wherein the flexible display device includes a folding area and non-folding areas on both sides of the folding area, the folding area is folded in an out-folding manner that a display surface of the flexible display device faces outward, and the Young's modulus of the first adhesive member is smaller than the Young's modulus of the second adhesive member.

8. The flexible display device according to claim 7, wherein the Young's modulus of the first adhesive member is 500 MPa to 3000 MPa, and the Young's modulus of the second adhesive member is 7000 MPa to 10000 MPa.

9. The flexible display device according to claim 1, wherein the adhesive member is formed of an optical clear resin.

10. The flexible display device according to claim 1, further comprising:
a protective film disposed on the cover member.

11. The flexible display device according to claim 10, wherein a width and a length of the cover member are equal to a width and a length of the protective film, respectively.

12. The flexible display device according to claim 10, wherein the protective film is a plastic film including at least one selected from polyethylene terephthalate, polyethylene naphthalate, polyethylene, polymethyl methacrylate, polyimide, polyamideimide, polycarbonate, cycloolefin polymer and cycloolefin copolymer.

13. The flexible display device according to claim 10, comprising:
a hard coating layer disposed on at least one surface of the protective film.

14. The flexible display device according to claim 13, wherein the hard coating layer includes a first hard coating layer disposed on an upper surface of the protective film and a second hard coating layer disposed on a lower surface of the protective film.

15. The flexible display device according to claim 14, wherein the first hard coating layer includes an acrylic resin, and the second hard coating layer includes a silicone resin.

16. The flexible display device according to claim 15, wherein the silicone resin is an epoxy modified silicone resin.

17. The flexible display device according to claim 14, wherein a thickness of the first hard coating layer is 5 μm to 20 μm and a thickness of the second hard coating layer is 30 μm to 60 μm.

18. The flexible display device according to claim 1, wherein the decoration pattern is disposed on one surface of the thin glass so as to overlap the non-display area.

19. The flexible display device according to claim 10, wherein the decoration pattern is disposed on a lower surface of the protective film so as to overlap the non-display area.

20. The flexible display device according to claim 1, wherein a thickness of the thin glass is 0.1 mm or smaller.

* * * * *